United States Patent
Kato et al.

(10) Patent No.: US 12,051,566 B2
(45) Date of Patent: Jul. 30, 2024

(54) PLASMA PROCESSING APPARATUS

(71) Applicant: Tokyo Electron Limited, Tokyo (JP)

(72) Inventors: Hitoshi Kato, Iwate (JP); Hiroyuki Kikuchi, Iwate (JP); Shinji Asari, Iwate (JP); Yuji Sawada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 375 days.

(21) Appl. No.: 17/648,436

(22) Filed: Jan. 20, 2022

(65) Prior Publication Data

US 2022/0230852 A1  Jul. 21, 2022

(30) Foreign Application Priority Data

Jan. 21, 2021 (JP) ................................ 2021-008287

(51) Int. Cl.
- *H01J 37/32* (2006.01)
- *C23C 16/50* (2006.01)
- *H01L 21/687* (2006.01)
- *C23C 16/458* (2006.01)
- *H01L 21/02* (2006.01)

(52) U.S. Cl.
CPC ........ *H01J 37/32422* (2013.01); *C23C 16/50* (2013.01); *H01J 37/32082* (2013.01); *H01J 37/32715* (2013.01); *H01L 21/68771* (2013.01); *C23C 16/4584* (2013.01); *H01J 37/3211* (2013.01); *H01J 37/3244* (2013.01); *H01J 2237/20214* (2013.01); *H01J 2237/332* (2013.01); *H01L 21/02164* (2013.01); *H01L 21/02274* (2013.01); *H01L 21/68764* (2013.01)

(58) Field of Classification Search
CPC .......... H01J 37/32422; H01J 37/32082; H01J 37/32715; H01J 2237/20214; H01J 2237/332; H01J 37/3211; H01J 37/3244; H01L 21/02164; H01L 21/02274; H01L 21/68764; H01L 21/68771; C23C 16/50; C23C 16/401; C23C 16/4581; C23C 16/4584; H01Q 1/22
See application file for complete search history.

(56) References Cited

U.S. PATENT DOCUMENTS

| | | | |
|---|---|---|---|
| 9,018,689 B1 * | 4/2015 | Hirochi ................... | C23C 16/52 |
| | | | 257/E21.038 |
| 2008/0099426 A1 * | 5/2008 | Kumar .................. | H01J 37/321 |
| | | | 156/345.3 |

(Continued)

FOREIGN PATENT DOCUMENTS

| | | | | |
|---|---|---|---|---|
| JP | 2006019414 A | * | 1/2006 | ........ H01J 37/32192 |
| JP | 2011-151343 | | 8/2011 | |

(Continued)

*Primary Examiner* — Jeffrie R Lund
(74) *Attorney, Agent, or Firm* — IPUSA, PLLC

(57) ABSTRACT

A plasma processing apparatus includes a process chamber. A turntable is disposed in the process chamber and is configured to receive a substrate along a circumferential direction thereof. A process gas supply nozzle is configured to supply a process gas to the turntable. A plasma antenna is disposed on the process chamber at a position covering at least a part of the process gas supply nozzle. An ion trap plate is disposed over the process gas supply nozzle at a position overlapping at least a part of the plasma antenna in the process chamber.

10 Claims, 15 Drawing Sheets

(56) References Cited

U.S. PATENT DOCUMENTS

| | | | | |
|---|---|---|---|---|
| 2008/0099431 | A1* | 5/2008 | Kumar | H01J 37/32449 204/192.12 |
| 2008/0101978 | A1* | 5/2008 | Ryabova | C04B 35/505 118/724 |
| 2009/0008034 | A1* | 1/2009 | Tahara | H01J 37/32633 156/345.35 |
| 2009/0325387 | A1* | 12/2009 | Chen | H01J 37/32862 216/60 |
| 2010/0093185 | A1* | 4/2010 | Kabe | H01L 21/02252 118/723 R |
| 2010/0130023 | A1* | 5/2010 | Nishita | H01L 21/28202 438/758 |
| 2010/0206846 | A1* | 8/2010 | Nishimura | H01L 21/02063 156/345.48 |
| 2012/0305185 | A1* | 12/2012 | Singh | H01J 37/32477 156/345.3 |
| 2013/0048606 | A1* | 2/2013 | Mao | C23F 4/00 216/67 |
| 2013/0081761 | A1* | 4/2013 | Sawada | H01J 37/32422 156/345.3 |
| 2015/0011093 | A1* | 1/2015 | Singh | H01L 21/67213 438/712 |
| 2015/0083582 | A1* | 3/2015 | Dhindsa | H01L 21/67069 204/298.35 |
| 2017/0218516 | A1* | 8/2017 | Miura | C23C 16/402 |
| 2018/0073146 | A1* | 3/2018 | Kato | H01J 37/321 |
| 2018/0151380 | A1* | 5/2018 | Ogawa | H01L 21/6719 |
| 2018/0230597 | A1* | 8/2018 | Ma | H01J 37/32357 |
| 2018/0245218 | A1* | 8/2018 | Kato | C23C 16/505 |
| 2018/0277338 | A1* | 9/2018 | Fukada | C23C 16/45544 |
| 2019/0006188 | A1* | 1/2019 | Hoshi | H01L 21/32136 |
| 2019/0382894 | A1* | 12/2019 | Kato | C23C 16/45544 |
| 2021/0151300 | A1* | 5/2021 | Jung | H01J 37/32724 |
| 2022/0165544 | A1* | 5/2022 | Kagaya | H01J 37/3244 |
| 2022/0223375 | A1* | 7/2022 | Kato | C23C 16/45521 |
| 2022/0230852 | A1* | 7/2022 | Kato | H01J 37/32422 |
| 2022/0336190 | A1* | 10/2022 | Kato | C23C 16/505 |
| 2022/0406572 | A1* | 12/2022 | Oyama | C23C 28/42 |
| 2023/0230817 | A1* | 7/2023 | Kato | H01J 37/321 427/569 |

FOREIGN PATENT DOCUMENTS

| | | | |
|---|---|---|---|
| JP | 2018-041685 | 3/2018 | |
| TW | 202141560 A * | 11/2021 | G06F 40/103 |
| TW | 202236422 A * | 9/2022 | H01L 21/31116 |
| TW | 202309973 A * | 3/2023 | H01J 37/321 |
| WO | WO-2023047960 A1 * | 3/2023 | |

* cited by examiner

ROTATIONAL DIRECTION OF TURNTABLE

PLASMA PROCESSING APPARATUS

CROSS-REFERENCE TO RELATED APPLICATION

The present application is based on and claims priority to Japanese Priority Application No. 2021-008287 filed on Jan. 21, 2021, the entire contents of which are hereby incorporated herein by reference.

BACKGROUND OF THE INVENTION

1. Field of the Invention

The present disclosure relates to a plasma processing apparatus.

2. Description of the Related Art

Japanese Laid-Open Patent Application Publication No. 2018-41685 discloses a plasma processing apparatus including an antenna device that includes an antenna including a plurality of antenna members extending along a predetermined track-like shape and having longitudinal coupling positions opposite to each other in a shorter direction so as to form a predetermined track-like shape having a longitudinal direction and a shorter direction. The antenna includes a deformable and electrically conductive coupling member connecting the ends of the adjacent plurality of antenna members, and at least two vertical moving mechanisms individually coupled to at least two of the plurality of antenna members and capable of raising and lowering at least two of the plurality of antenna members so as to change the bending angle of the coupling member as a fulcrum.

SUMMARY OF THE INVENTION

The present disclosure provides a plasma processing apparatus capable of regulating a supply of ions generated by plasma.

According to one embodiment of the present disclosure, there is provided a plasma processing apparatus including a process chamber. A turntable is disposed in the process chamber and is configured to receive a substrate along a circumferential direction thereof. A process gas supply nozzle is configured to supply a process gas to the turntable. A plasma antenna is disposed on the process chamber at a position covering at least a part of the process gas supply nozzle. An ion trap plate is disposed over the process gas supply nozzle at a position overlapping at least a part of the plasma antenna in the process chamber.

DETAILED DESCRIPTION OF THE PREFERRED EMBODIMENTS

Hereinafter, embodiments for carrying out the present invention will be described with reference to the drawings.
[Configuration of Plasma Processing Apparatus]

Figure 1:
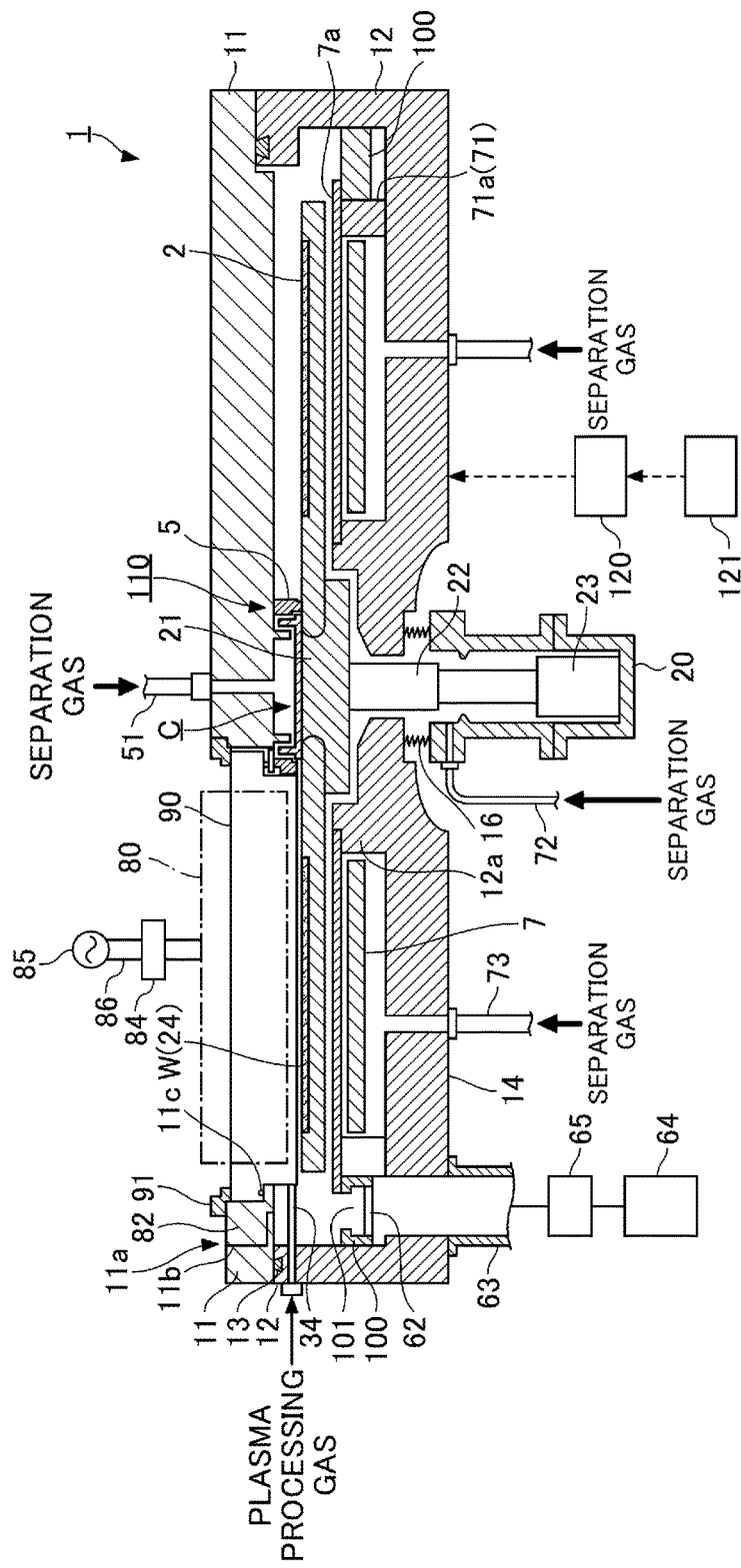
FIG. 1 is a vertical schematic cross-sectional view illustrating a plasma processing apparatus according to an embodiment of the present disclosure.
Figure 2:
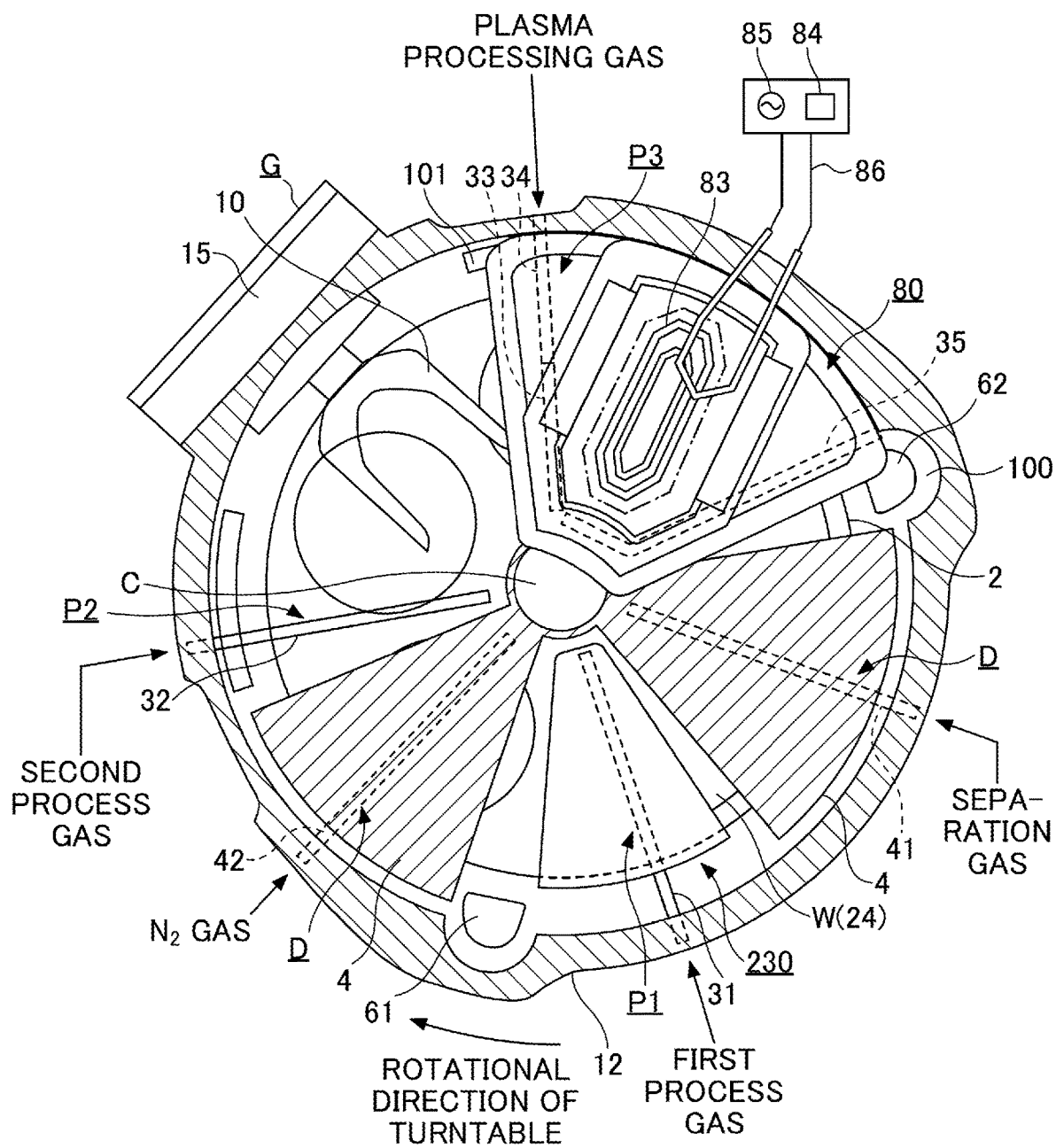
FIG. 2 is a schematic plan view illustrating a configuration of a plasma processing apparatus according to an embodiment of the present disclosure.

FIG. 1 is a schematic vertical cross-sectional view illustrating an example of a plasma processing apparatus according to an embodiment of the present invention. FIG. 2 is a schematic plan view illustrating an example of the plasma processing apparatus according to the embodiment. In FIG. 2, for convenience of explanation, a depiction of a top plate 11 is omitted.

As illustrated in FIG. 1, the plasma processing apparatus of the embodiment includes a vacuum chamber 1 having a substantially circular planar shape, and a susceptor 2 that is disposed in the vacuum chamber 1 such that the rotational center of the susceptor 2 coincides with the center of the vacuum chamber 1. The susceptor 2 rotates wafers W placed thereon by rotating around its rotational center.

The vacuum chamber 1 is a process chamber to accommodate wafers W therein and to perform a plasma process on a film or the like deposited on surfaces of the wafers W. The vacuum chamber 1 includes a top plate (ceiling) 11 that faces recesses 24 formed in a surface of the susceptor 2, and a chamber body 12. A ring-shaped seal member 13 is provided at the periphery of the upper surface of the chamber body 12. The top plate 11 is configured to be attachable to and detachable from the chamber body 12. The diameter (inside diameter) of the vacuum chamber 1 in plan view is, for example, about 1100 mm, but is not limited to this.

A separation gas supply pipe 51 is connected to the center of the upper side of the vacuum chamber 1 (or the center of the top plate 11). The separation gas supply pipe 51 supplies a separation gas to a central area C in the vacuum chamber 1 to prevent different process gases from mixing with each other in the central area C.

A central part of the susceptor 2 is fixed to an approximately-cylindrical core portion 21. A rotational shaft 22 is connected to a lower surface of the core portion 21 and extends in the vertical direction. The susceptor 2 is configured to be rotatable by a drive unit 23 about the vertical axis of the rotational shaft 22, in a clockwise fashion in the example of FIG. 2. The diameter of the susceptor 2 is, for example, but is not limited to, about 1000 mm.

The rotational shaft 22 and the drive unit 23 are housed in a case body 20. An upper-side flange of the case body 20 is hermetically attached to the lower surface of a bottom part 14 of the vacuum chamber 1. A purge gas supply pipe 72 is connected to the case body 20. The purge gas supply pipe 72 supplies a purge gas (separation gas) such as argon gas to an area below the susceptor 2.

A part of the bottom part 14 of the vacuum chamber 1 surrounding the core portion 21 forms a ring-shaped protrusion 12a that protrudes so as to approach the susceptor 2 from below.

Circular recesses 24 (or substrate receiving areas), where the wafers W having a diameter of, for example, 300 mm are placed, are formed in the upper surface of the susceptor 2. A plurality of (e.g., five) recesses 24 are provided along the rotational direction of the susceptor 2. Each of the recesses 24 has an inner diameter that is slightly (e.g., from 1 mm to 4 mm) greater than the diameter of the wafer W. The depth of the recess 24 is substantially the same as or greater than the thickness of the wafer W. Accordingly, when the wafer W is placed in the recess 24, the height of the upper surface of the wafer W becomes substantially the same as or lower than the height of the upper surface of the susceptor 2 where the wafers W are not placed. When the depth of the recess 24 is excessively greater than the thickness of the wafer W, it may adversely affect film deposition. Therefore, the depth of the recess 24 is preferably less than or equal to about three times the thickness of the wafer W. Through holes (not illustrated in the drawings) are formed in the bottom of the recess 24 to allow a plurality of (e.g., three) lifting pins (which are described later) to pass through. The lifting pins raise and lower the wafer W.

As illustrated in FIG. 2, a first process area P1, a second process area P2 and a third process area P3 are provided apart from each other along the rotational direction of the susceptor 2. Because the third process area P3 is a plasma processing area, it may be also referred to as a plasma processing area P3 hereinafter. A plurality of (e.g., seven) gas nozzles 31, 32, 33, 34, 35, 41, and 42 made of, for example, quartz are arranged at intervals in a circumferential direction of the vacuum chamber 1. The gas nozzles 31 through 35, 41, and 42 extend radially, and are disposed to face areas that the recesses 24 of the susceptor 2 pass through. The nozzles 31 through 35, 41, and 42 are placed between the susceptor 2 and the top plate 11. Here, each of the gas nozzles 31 through 35, 41, and 42 extends horizontally from the outer wall of the vacuum chamber 1 toward the central area C so as to face the wafers W. On the other hand, the gas nozzle 35 extends from the outer wall of the vacuum chamber 1 toward the central area C, and then bends and extends linearly along the central area C in a counterclockwise fashion (opposite direction of the rotational direction of the susceptor 2). In the example of FIG. 2, plasma processing gas nozzles 33 and 34, a plasma processing gas nozzle 35, a separation gas nozzle 41, a first process gas nozzle 31, a separation gas nozzle 42 and a second process gas nozzle 32 are arranged in a clockwise fashion (the rotational direction of the susceptor 2) from a transfer opening 15 in this order. Here, a gas supplied from the second process gas nozzle 32 is often similar to a gas supplied from the plasma processing gas nozzles 33 through 35, but the second process gas nozzle 32 may not be necessarily provided when the plasma processing gas nozzles 33 through 35 sufficiently supply the gas.

Also, the plasma processing gas nozzles 33 to 35 may be substituted with a single plasma processing gas nozzle. In this case, for example, a plasma processing gas nozzle extending from the outer peripheral wall of the vacuum chamber 1 toward the central region C may be disposed, similar to the second process gas nozzle 32.

The first process gas nozzle 31 forms a "first process gas supply part". Each of the plasma processing gas nozzles 33, 34 and 35 forms a "plasma processing gas supply part". Each of the separation gas nozzles 41 and 42 forms a "separation gas supply part".

Each of the gas nozzles 31 through 35, 41, and 42 is connected to gas supply sources (not illustrated in the drawings) via a flow control valve.

Gas discharge holes 36 for discharging a gas are formed in the lower side (which faces the susceptor 2) of each of the nozzles 31 through 35, 41, and 42. The gas discharge holes 36 are formed, for example, at regular intervals along the radial direction of the susceptor 2. The distance between the lower end of each of the nozzles 31 through 35, 41, and 42 and the upper surface of the susceptor 2 is, for example, from about 1 mm to about 5 mm.

An area below the first process gas nozzle 31 is a first process area P1 where a first process gas is adsorbed on the wafer W. An area below the second process gas nozzle 32 is a second process area P2 where a second process gas that can produce a reaction product by reacting with the first process gas is supplied to the wafer W. An area below the plasma processing gas nozzles 33 through 35 is a third process area P3 where a modification process is performed on a film on the wafer W. The separation gas nozzles 41 and 42 are provided to form separation areas D for separating the first process area P1 from the second process area P2, and separating the third process area P3 from the first process area P1, respectively. Here, the separation area D is not provided between the second process area P2 and the third process area P3. This is because the second process gas supplied in the second process area P2 and the mixed gas supplied in the third process area P3 partially contain a common component therein in many cases, and therefore the second process area P2 and the third process area P3 do not have to be separated from each other by particularly using the separation gas.

Although described in detail later, the first process gas nozzle 31 supplies a source gas that forms a principal component of a film to be deposited. For example, when the film to be deposited is a silicon oxide film ($SiO_2$), the first process gas nozzle 31 supplies a silicon-containing gas such as an organic aminosilane gas. The second process gas nozzle 32 supplies an oxidation gas such as oxygen gas and ozone gas. The plasma processing gas nozzles 33 through 35 supply a mixed gas containing the same gas as the second process gas and a noble gas to perform a modification process on the deposited film. For example, when the film to be deposited is the silicon oxide film ($SiO_2$), the plasma processing gas nozzles 33 through 35 supply a mixed gas of the oxidation gas such as oxygen gas and ozone gas same as the second process gas and a noble gas such as argon and helium. Because the plasma processing gas nozzles 33 to 35 are configured to supply gases to different regions on the susceptor 2, the flow ratio of the noble gas may vary from region to region, and the modification process may be performed uniformly.

Figure 3:
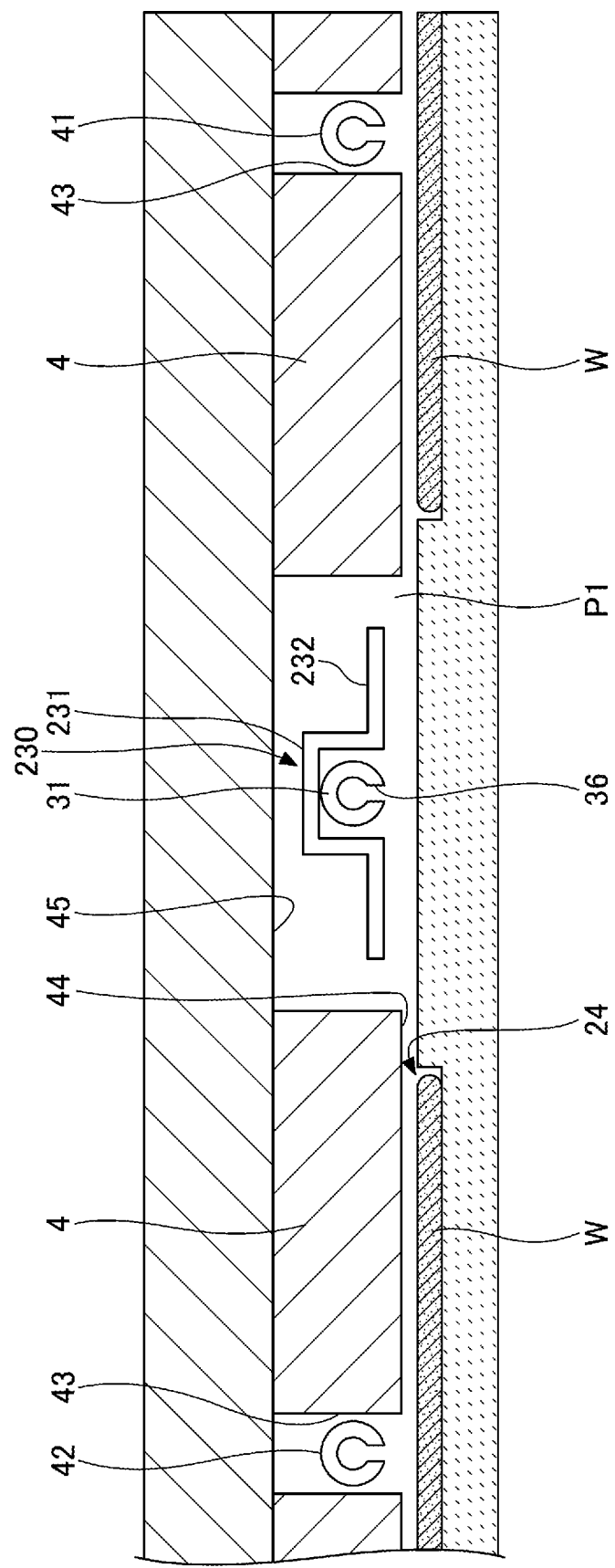
FIG. 3 is a cross-sectional view along a concentric circle of a susceptor of a plasma processing apparatus according to an embodiment of the present disclosure.

FIG. 3 illustrates a cross section of a part of the substrate processing apparatus taken along a concentric circle of the susceptor 2. More specifically, FIG. 3 illustrates a cross section of a part of the substrate processing apparatus from one of the separation areas D through the first process area P1 to the other one of the separation areas D.

Approximately fan-like convex portions 4 are provided on the lower surface of the top plate 11 of the vacuum chamber 1 at locations corresponding to the separation areas D. The convex portions 4 are attached to the back surface of the top plate 11. In the vacuum chamber 1, flat and low ceiling surfaces 44 (first ceiling surfaces) are formed by the lower surfaces of the convex portions 4, and ceiling surfaces 45 (second ceiling surfaces) are formed by the lower surface of the top plate 11. The ceiling surfaces 45 are located on both sides of the ceiling surfaces 44 in the circumferential direction, and are located higher than the ceiling surfaces 44.

As illustrated in FIG. 2, each of the convex portions 4 forming the ceiling surface 44 has a fan-like planar shape whose apex is cut off to form an arc-shaped side. Also, a groove 43 extending in the radial direction is formed in each of the convex portions 4 at the center in the circumferential direction. Each of the separation gas nozzles 41 and 42 is placed in the groove 43. A peripheral part of the convex portion 4 (a part along the outer edge of the vacuum chamber 1) is bent to form an L-shape to prevent the process gases from mixing with each other. The L-shaped part of the convex portion 4 faces the outer end surface of the susceptor 2 and is slightly apart from the chamber body 12.

A nozzle cover 230 is provided above the first process gas nozzle 31. The nozzle cover 230 causes the first process gas to flow along the wafer W, and causes the separation gas to flow near the top plate 11 instead of near the wafer W. As illustrated in FIG. 3, the nozzle cover 230 includes an approximately-box-shaped cover body 231 having an opening in the lower side to accommodate the first process gas nozzle 31, and current plates 232 connected to the upstream and downstream edges of the opening of the cover body 231 in the rotational direction of the susceptor 2. A side wall of the cover body 231 near the rotational center of the susceptor 2 extends toward the susceptor 2 to face a tip of the first process gas nozzle 31. Another side wall of the cover body 231 near the outer edge of the susceptor 2 is partially cut off so as not to interfere with the first process gas nozzle 31.

As illustrated in FIG. 2, a plasma generating device 80 is provided above the plasma processing gas nozzles 33 through 35 to convert a plasma processing gas discharged into the vacuum chamber 1 to plasma.

Figure 4:
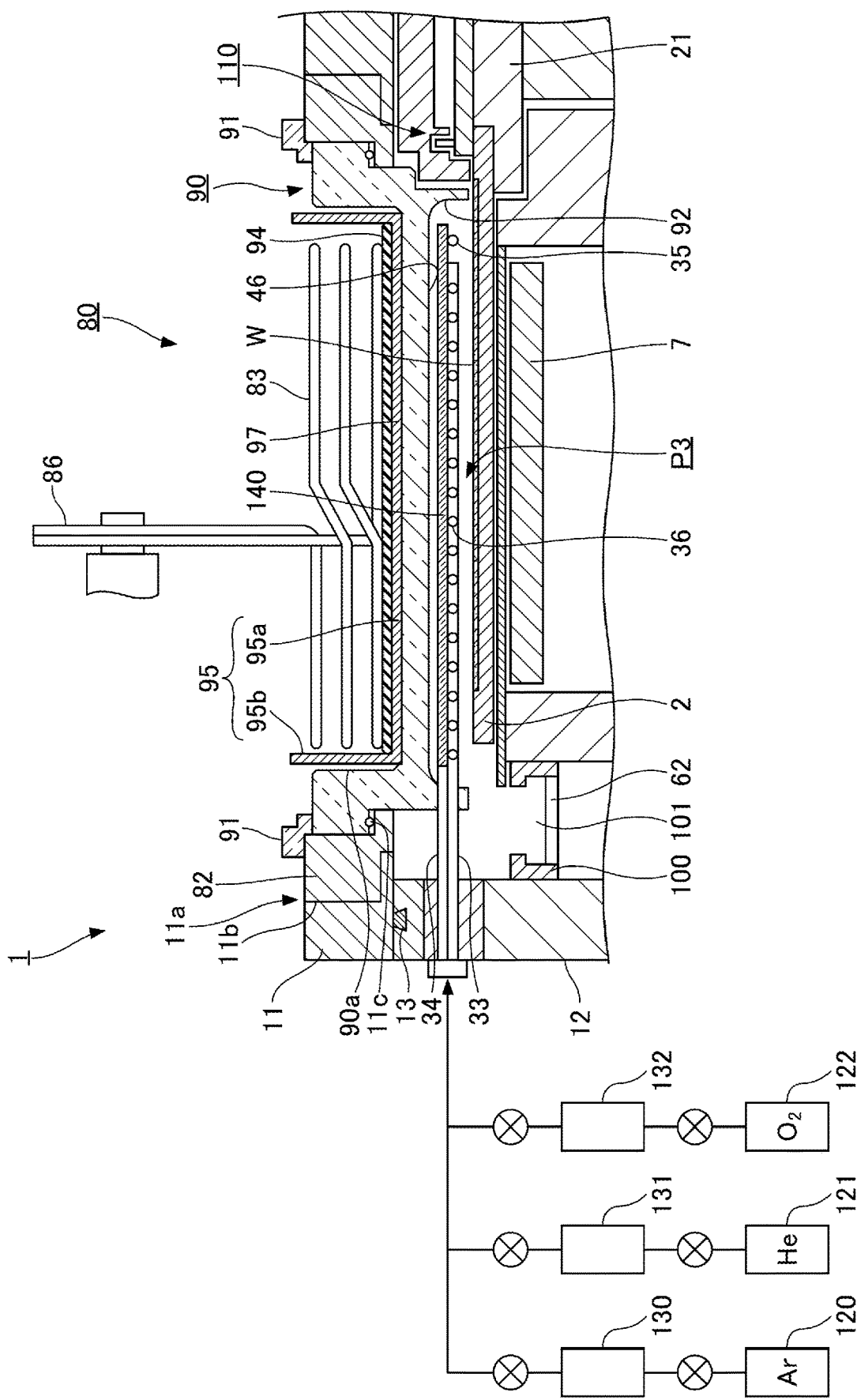
FIG. 4 is an example of a longitudinal sectional view of a plasma generator of a plasma processing apparatus according to an embodiment of the present disclosure.
Figure 5:
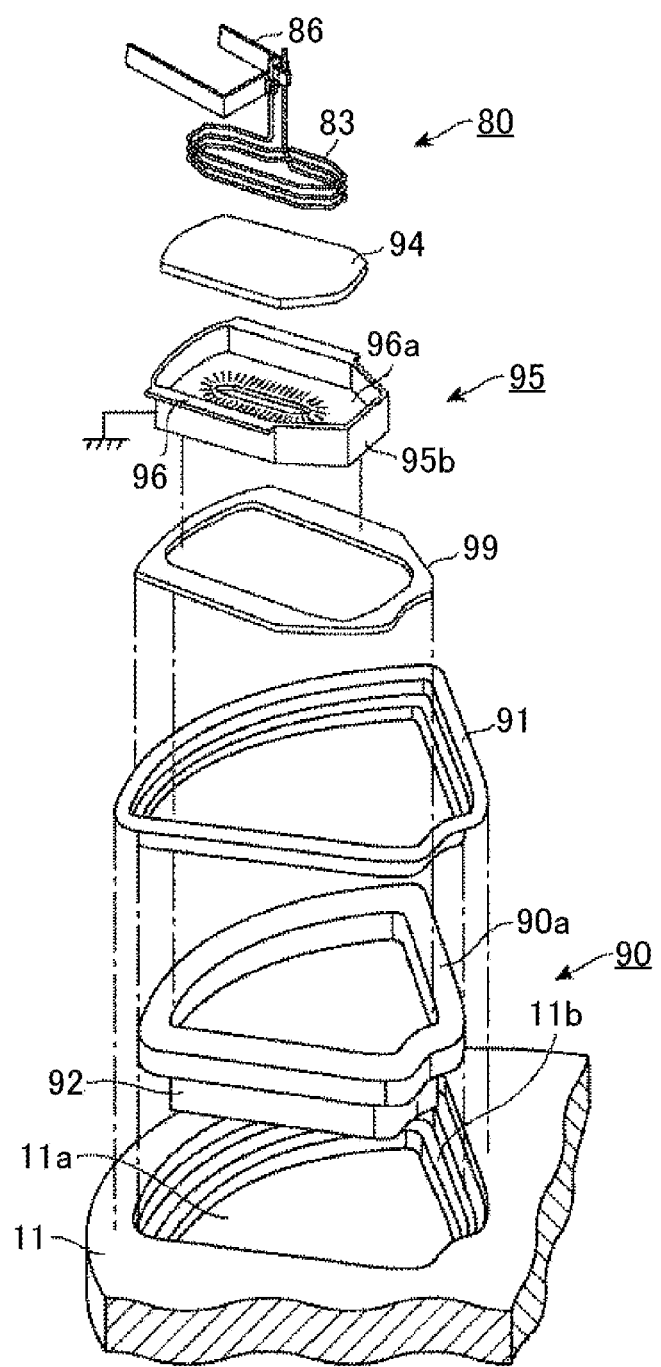
FIG. 5 is an exploded perspective view of an example of a plasma generator of a plasma processing apparatus according to an embodiment of the present disclosure.
Figure 6:
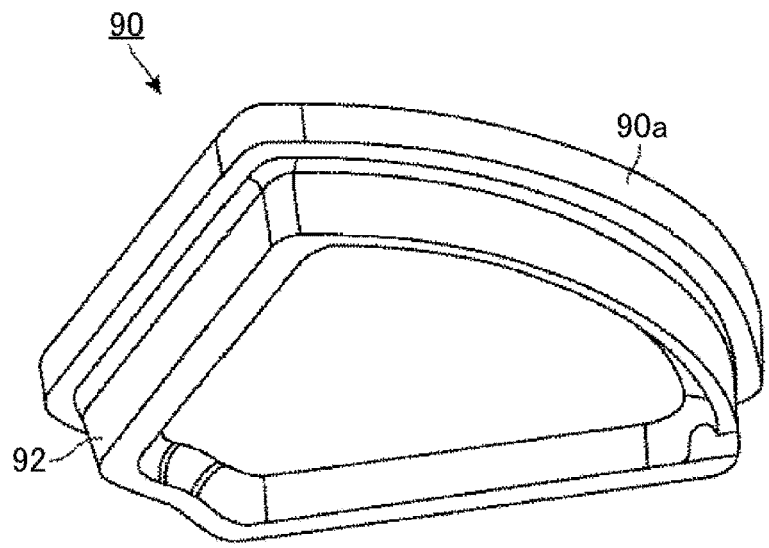
FIG. 6 is a perspective view of an example of a housing disposed in a plasma generator of a plasma processing apparatus according to an embodiment of the present disclosure.

FIG. 4 is a vertical cross-sectional view of an example of the plasma generating device 80. FIG. 5 is an exploded perspective view of an example of the plasma generating device 80. FIG. 6 is a perspective view of an example of a housing 90 of the plasma generating device 80.

The plasma generating device 80 is configured by winding an antenna 83 made of a metal wire or the like, for example, three times around a vertical axis in a coil form. In plan view, the plasma generating device 80 is disposed to surround a strip-shaped area extending in the radial direction of the susceptor 2 and to extend across the diameter of the wafer W on the susceptor 2.

The antenna 83 is connected through a matching box 84 to a high frequency power source 85 that has, for example, a frequency of 13.56 MHz and output power of 5000 W. The antenna 83 is hermetically separated from the inner area of the vacuum chamber 1. As illustrated in FIGS. 1, 2, and 4, a connection electrode 86 electrically connects the antenna 83, the matching box 84, and the high frequency power source 85.

The antenna 83 has a foldable configuration at the top and the bottom, and has a lifting mechanism enabling the antenna 83 to be folded automatically at the top and the bottom. However, in FIG. 2, details thereof are omitted. The details are described later.

As illustrated in FIGS. 4 and 5, an opening 11a having an approximately fan-like shape in plan view is formed in the top plate 11 above the plasma processing gas nozzles 33 through 35.

An ion trap plate is disposed over the plasma processing gas nozzles 33 to 35. The ion trap plate 140 is a shield plate for limiting the supply of generated plasma ions to the wafer W and for improving uniformity of plasma processing across a surface of the wafer W. Details of the ion trap plate 130 will be described later. First, components other than the ion trap plate 140, which are necessary for the plasma processing apparatus, will be mainly described.

As illustrated in FIG. 4, a ring-shaped member 82 is hermetically attached to the periphery of the opening 11a. The ring-shaped member 82 extends along the periphery of the opening 11a. The housing 90 is hermetically attached to the inner circumferential surface of the ring-shaped member 82. That is, the outer circumferential surface of the ring-shaped member 82 faces an inner surface 11b of the opening 11a of the top plate 11, and the inner circumferential surface of the ring-shaped member 82 faces a flange part 90a of the housing 90. The housing 90 is placed via the ring-shaped member 82 in the opening 11a to enable the antenna 83 to be placed at a position lower than the top plate 11. The housing 90 may be made of a dielectric material such as quartz. The bottom surface of the housing 90 forms a ceiling surface 46 of the plasma processing area P3.

As illustrated in FIG. 6, an upper peripheral part surrounding the entire circumference of the housing 90 extends horizontally to form the flange part 90a. Moreover, a central part of the housing 90 in plan view is recessed toward the inner area of the vacuum chamber 1.

The housing 90 is arranged so as to extend across the diameter of the wafer W in the radial direction of the susceptor 2 when the wafer W is located under the housing 90. A seal member 11c such as an O-ring is provided between the ring-shaped member 82 and the top plate 11.

The internal atmosphere of the vacuum chamber 1 is hermetically sealed by the ring-shaped member 82 and the housing 90. As illustrated in FIG. 5, the ring-shaped member 82 and the housing 90 are placed in the opening 11a, and the entire circumference of the housing 90 is pressed downward via a frame-shaped pressing member 91 that is placed on the upper surfaces of the ring-shaped member 82 and the housing 90 and extends along a contact region between the ring-shaped member 82 and the housing 90. The pressing member 91 is fixed to the top plate 11 with, for example, bolts (not illustrated in the drawing). As a result, the internal atmosphere of the vacuum chamber 1 is sealed hermetically. In FIG. 5, a depiction of the ring-shaped member 82 is omitted for simplification.

As illustrated in FIG. 6, the housing 90 also includes a protrusion 92 that extends along the circumference of the housing 90 and protrudes vertically from the lower surface of the housing 90 toward the susceptor 2. The protrusion 92 surrounds the second process area P2 below the housing 90. The plasma processing gas nozzles 33 through 35 are accommodated in an area surrounded by the inner circumferential surface of the protrusion 92, the lower surface of the housing 90, and the upper surface of the susceptor 2. A part of the protrusion 92 near a base end (at the inner wall of the vacuum chamber 1) of each of the plasma processing gas nozzles 33 through 35 is cut off to form an arc-shaped cut-out that conforms to the outer shape of each of the plasma processing gas nozzles 33 through 35.

As illustrated in FIG. 4, on the lower side (i.e., the second process area P2) of the housing 90, the protrusion 92 is formed along the circumference of the housing 90. The protrusion 92 prevents the seal member 11c from being directly exposed to plasma, i.e., isolates the seal member 11c from the second process area P2. This causes plasma to pass through an area under the protrusion 92 even when plasma spreads from the second process area P2 toward the seal member 11c, thereby deactivating the plasma before reaching the seal member 11c.

Moreover, as illustrated in FIG. 4, the plasma processing gas nozzles 33 through 35 are provided in the third process area P3 under the housing 90, and are connected to an argon gas supply source 120, a helium gas supply source 121 and an oxygen gas supply source 122, respectively. Furthermore, corresponding flow controllers 130, 131 and 132 are provided between the plasma processing gas nozzles 33 through 35 and the argon gas supply source 120, the helium gas supply source 121 and the oxygen gas supply source 122, respectively. Ar gas, He gas and $O_2$ gas are supplied from the argon gas supply source 120, the helium gas supply source 121 and the oxygen gas supply source 122 to each of the plasma processing gas nozzles 33 through 35 at predetermined flow rates (mixing ratios, mix proportions) through each of the flow controllers 130, 131 and 132, and flow rates thereof are determined depending on supplied areas.

When a single plasma processing gas nozzle is used, for example, the mixture of the above-described Ar gas, He gas, and $O_2$ gas is supplied to the single plasma processing gas nozzle.

Figure 7:
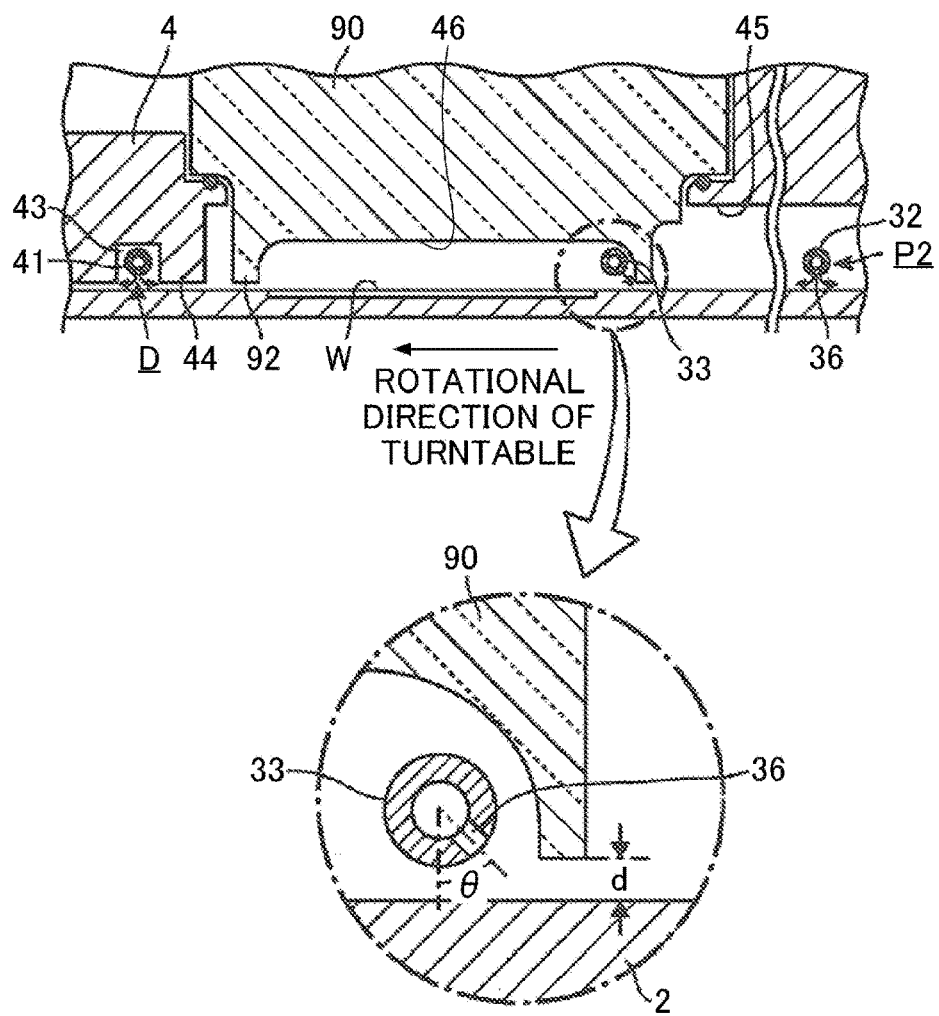
FIG. 7 is a vertical cross-sectional view of a plasma processing apparatus cut through a vacuum chamber along a rotational direction of a susceptor according to an embodiment of the present disclosure.

FIG. 7 is a vertical cross-sectional view of the vacuum chamber 1 taken along the rotational direction of the susceptor 2. As illustrated in FIG. 7, because the susceptor 2 rotates in a clockwise fashion during the plasma process, Ar gas is likely to intrude into an area under the housing 90 from a clearance between the susceptor 2 and the protrusion 92 by being brought by the rotation of the susceptor 2. To prevent Ar gas from intruding into the area under the housing 90 through the clearance, a gas is discharged to the clearance from the area under the housing 90. More specifically, as illustrated in FIGS. 4 and 7, the gas discharge holes 36 of the plasma processing gas nozzle 34 are arranged to face the clearance, that is, to face the upstream side in the rotational direction of the susceptor 2 and downward. A facing angle θ of the gas discharge holes 36 of the plasma processing gas nozzle 33 relative to the vertical axis may be, for example, about 45 degrees as illustrated in FIG. 7, or may be about 90 degrees so as to face the inner side wall of the protrusion 92. In other words, the facing angle θ of the gas discharge holes 36 may be set at an appropriate angle capable of properly preventing the intrusion of Ar gas in a range from 45 to 90 degrees depending on the intended use.

Figure 8:
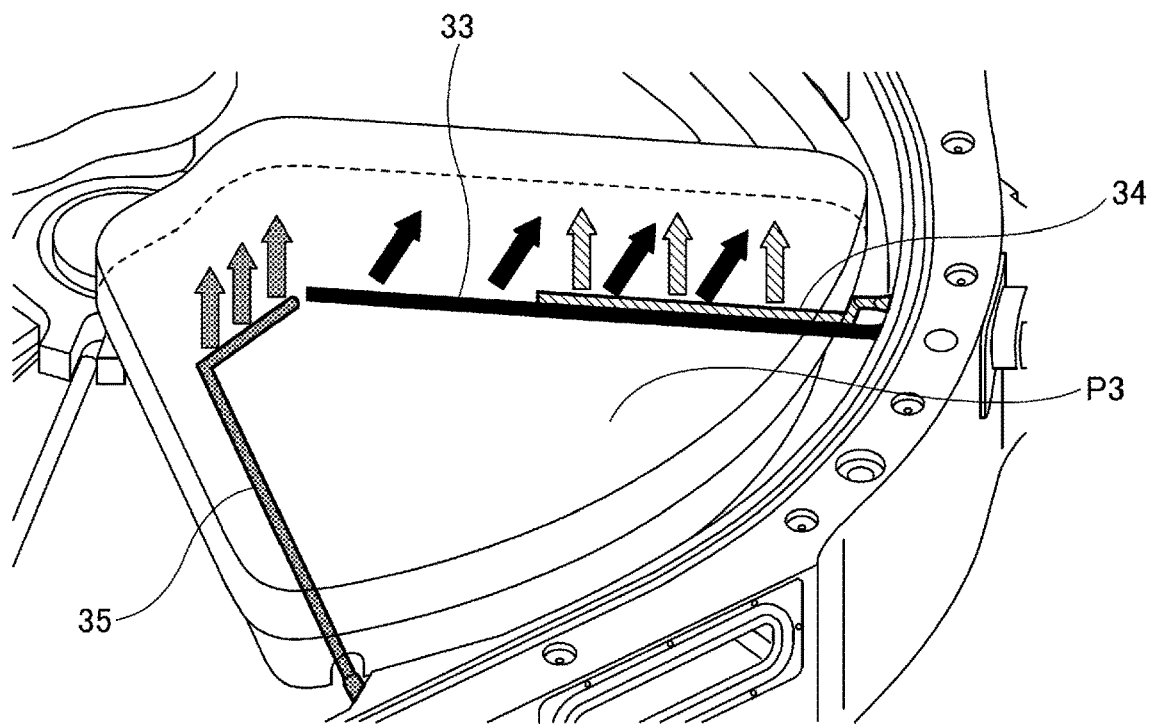
FIG. 8 is a perspective view illustrating an enlarged view of a gas nozzle for plasma processing disposed in a plasma processing region of a plasma processing apparatus according to an embodiment of the present disclosure.

FIG. 8 is an enlarged perspective view illustrating the plasma processing gas nozzles 33 through 35 provided in the plasma processing area P3. As illustrated in FIG. 8, the plasma processing gas nozzle 33 is a nozzle capable of covering the whole of the recess 24 in which the wafer W is placed, and supplying a plasma processing gas to the entire surface of the wafer W. On the other hand, the plasma processing gas nozzle 34 is a nozzle provided slightly above the plasma processing gas nozzle 33 so as to approximately overlap the plasma processing gas nozzle 33. The length of the plasma processing gas nozzle 34 is about half the length of the plasma processing gas nozzle 33. The plasma processing gas nozzle 35 extends from the outer peripheral wall of the vacuum chamber 1 along the radius of the downstream side of the fan-like plasma process area P3 in the rotational direction of the susceptor 2, and has a shape bent linearly along the central area C after reaching the neighborhood of the central area C. Hereinafter, for convenience of distinction, the plasma processing gas nozzle 33 covering the whole area may be referred to as a base nozzle 33, and the plasma processing gas nozzle 34 covering only the outer area may be referred to as an outer nozzle 34. Also, the plasma processing gas nozzle 35 extending to the inside may be referred to as an axis-side nozzle 35.

The base nozzle 33 is a gas nozzle for supplying a plasma processing gas to the whole surface of the wafer W. As illustrated in FIG. 7, the base gas nozzle 33 discharges the plasma processing gas toward the protrusion 92 forming the side surface separating the plasma process area P3 from the other area.

On the other hand, the outer nozzle 34 is a nozzle for supplying a plasma processing gas selectively to an outer area of the wafer W. The plasma processing gas supplied to the plasma process area P3 is converted to plasma by passing through the highest part of the plasma process area P3, which is also close to the plasma generating device 80. More specifically, because the plasma generating device 80 is provided above the plasma processing area P3, the plasma processing gas flowing along the ceiling surface 46 (see FIG. 7) of the plasma processing area P3 is converted to plasma, which contributes to the plasma process. In other words, the neighborhood of the ceiling surface 46 of the plasma processing area P3 forms a plasma generation area, and the plasma processing gas having passed the plasma generation area is properly converted to the plasma. The outer nozzle 34 performs a process for increasing a flow rate of a plasma processing gas supplied from the outer nozzle 34 and a flow speed of the plasma processing gas of the outer area when an amount of plasma process performed on a film deposited on the wafer W after the plasma process is obtained and the result of the amount of plasma process is insufficient in the outer area. As the flow speed of the plasma processing gas increases, the amount of plasma processing gas converted to the plasma per unit time increases, which accelerates the plasma process. Accordingly, based on this perspective, the gas discharge holes 36 (not illustrated in the drawings) of the outer nozzle 34 are provided to face upward and the ceiling surface 46 of the plasma processing area P3, and are configured to lead the supplied plasma processing gas to the ceiling surface 46 of the plasma process area P2.

The axis-side nozzle 35 is a nozzle for supplying a plasma processing gas selectively to an area near the axis of the susceptor 2 of the wafer W. Hence, the gas discharge holes 36 (not illustrated in the drawings) are formed only in a part of the tip of the axis-side nozzle 35 extending along the central area C, and are configured to supply the plasma processing gas to the area of the wafer W near the axis of the susceptor 2. In the axis-side nozzle 35, the gas discharge holes 36 also face upward and are provided at a location facing the ceiling surface 46 of the plasma processing area P3. This causes the plasma processing gas supplied from the axis-side nozzle 35 to immediately flow toward the plasma generation area and to be converted to plasma efficiently. In the event that an insufficient plasma process on the wafer W in the area near the axis of the susceptor 2 is found when obtaining a processing distribution within a surface of a film on the wafer W after the plasma process, a process for increasing a flow rate and thereby increasing a flow speed of the plasma processing gas supplied from the axis-side nozzle 35 is performed. Because the amount of plasma converted from the plasma processing gas per unit time increases as the flow rate of the plasma processing gas increases, the plasma process is accelerated. In view of this, the gas discharge holes 36 of the outer nozzle 34 (not illustrated in the drawing) are provided to face upward so as to face the ceiling surface 46 of the plasma processing area P3, and are configured to cause the plasma processing gas to flow toward the ceiling surface 46 of the plasma processing area P3.

The axis-side nozzle 35 is a nozzle to mainly supply the plasma processing gas to the central area near the axial side of the susceptor 2 on the wafer W. Hence, the gas discharge holes 36 (not illustrated in the drawing) are formed only in a portion of the tip the axis-side nozzle 35 along the central area C, and are configured to supply the plasma processing gas to the area on the central side of the wafer W. Even in the axis-nozzle 35, the gas discharge holes 36 face upward and provided in a position opposite to the ceiling surface 456 of the plasma processing area P3. Thus, the plasma processing gas supplied from the axis-side nozzle 35 immediately goes toward the plasma generation area and is efficiently converted to plasma.

In this manner, by providing the outer nozzle 34 and the axis-side nozzle 35 in addition to the base nozzle 33, the flow ratio (mixing ratio, or mix proportion) of the noble gas and the reaction gas contained in the mixed gas can be adjusted for each area, thereby adjusting the quantity of processing across the surface of the film on the wafer W.

The adjustment of the quantity of processing across the surface of the wafer W is generally performed to improve the uniformity of the plasma process across the surface of the wafer W, but when making a difference of the amount of plasma process for each area is desired, a flow ratio of helium gas contained in the plasma processing gas supplied from the nozzles 33 through 35 to the area desired to increase the quantity of processing just has to be increased, and the mixing ratio (mix proportion) of helium gas just has to be increased. Accordingly, in addition to the improvement of the process uniformity across the surface of the wafer W, a variety of adjustments of the quantity of processing is possible.

In this manner, by providing the plasma processing gas nozzles 34 and 35 for flow rate adjustment for each area, the adjustment of the amount of plasma process across the surface can be performed readily and accurately. In FIG. 8, although an example of including three of the plasma processing gas nozzles 33 through 35 is illustrated, the adjustment of the quantity of processing across the surface may be performed more finely and accurately by installing more plasma processing gas nozzles. The number, a shape, an installation location and the like of the plasma processing gas nozzles 33 through 35 can be changed depending on the intended use.

Next, a detailed description is given below of a Faraday shield 95 of the plasma generating device 80. As illustrated in FIGS. 4 and 5, a Faraday shield 95 is provided on the upper side of the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95*a* that extends horizontally along the bottom surface of the housing 90, and a vertical surface 95*b* that extends upward from the outer edge of the horizontal surface 95*a* and surrounds the horizontal surface 95*a*. The Faraday shield 95 may be configured to be, for example, a substantially hexagonal shape in a plan view.

Figure 9:
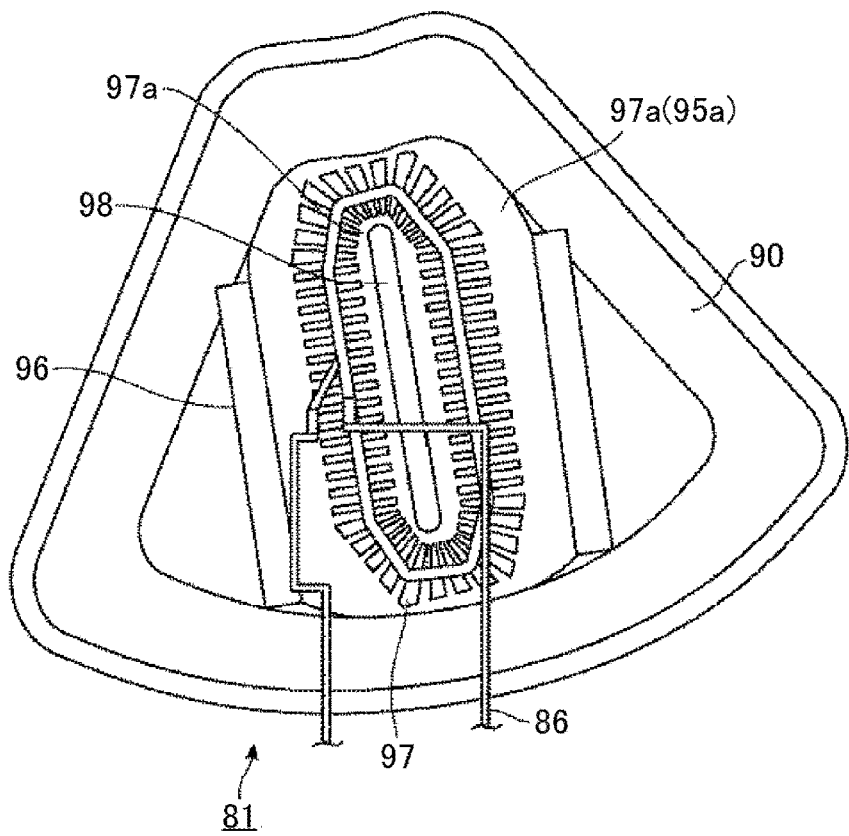
FIG. 9 is a plan view of an example of a plasma generator of a plasma processing apparatus according to an embodiment of the present disclosure.
Figure 10:
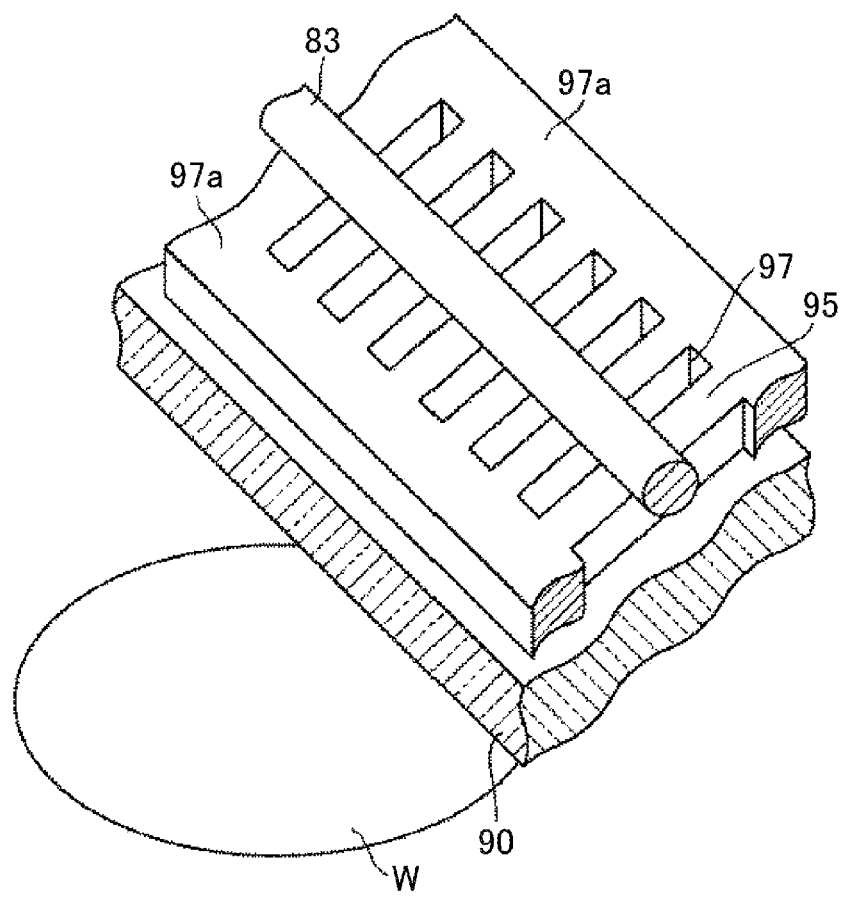
FIG. 10 is a perspective view illustrating a part of a Faraday shield disposed in a plasma generator of a plasma processing apparatus according to an embodiment of the present disclosure.

FIG. 9 is a plan view of an example of the plasma generating device 80. FIG. 10 is a perspective view of a part of the Faraday shield 95 provided in the plasma generating device 80.

When seen from the rotational center of the susceptor 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the central area C and a part of the flange part 90*a* near the outer edge of the susceptor 2.

When an electric field reaches the wafer W, for example, electric wiring and the like formed inside the wafer W may be electrically damaged. To prevent this problem, as illustrated in FIG. 10, a plurality of slits 97 is formed in the horizontal surface 95*a*. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 9 and 10, the slits 97 extend in directions that are orthogonal to the direction in which the antenna 83 is wound, and are arranged to form a circle below the antenna 83. The width of each slit 97 is set at a value that is about ¹⁄₁₀₀₀₀ or less of the wavelength of a high frequency supplied to the antenna 83. Circular electrically-conducting paths 97*a* made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 2, the slits 97 are omitted for simplification, but an area where the slits 97 are formed is indicated by a dashed-dotted line.

As illustrated in FIG. 5, an insulating plate 94 is stacked on the horizontal surface 95*a* of the Faraday shield 95. The insulating plate 94 is made of, for example, quartz having a thickness of about 2 mm, and is used for insulation between the Faraday shield 95 and the plasma generating device 80 disposed over the Faraday shield 95. Thus, the plasma generating device 80 is arranged to cover the inside of the vacuum chamber 1 (i.e., the wafer W on the susceptor 2) through the housing 90, the Faraday shield 95, and the insulating plate 94.

Next, an example of an antenna device 81 for holding an antenna according to an embodiment of the present disclosure and a plasma generating device 80 will be described.

Figure 11:
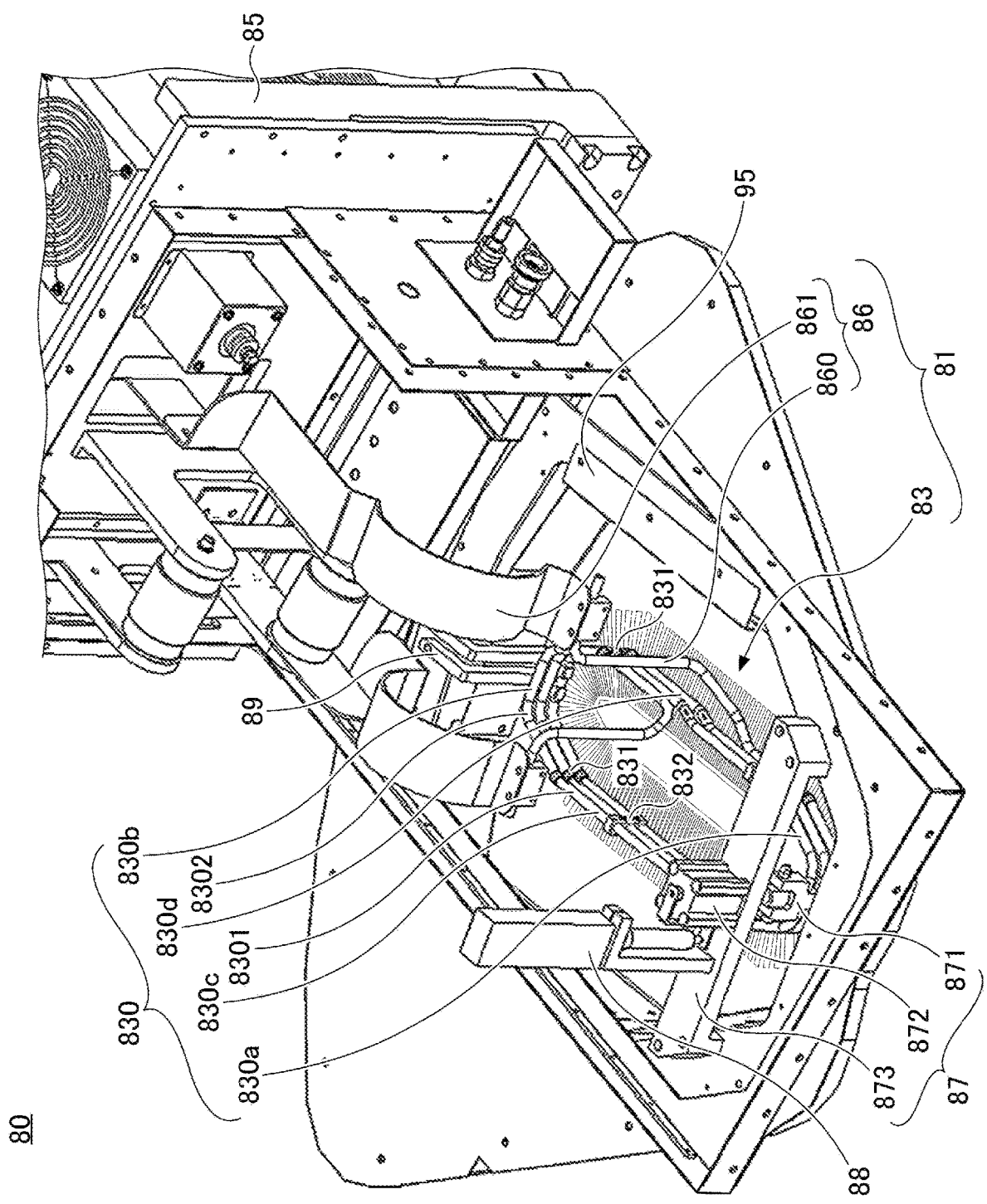
FIG. 11 is a perspective view of a plasma processing apparatus according to embodiments of the present disclosure.
Figure 12:
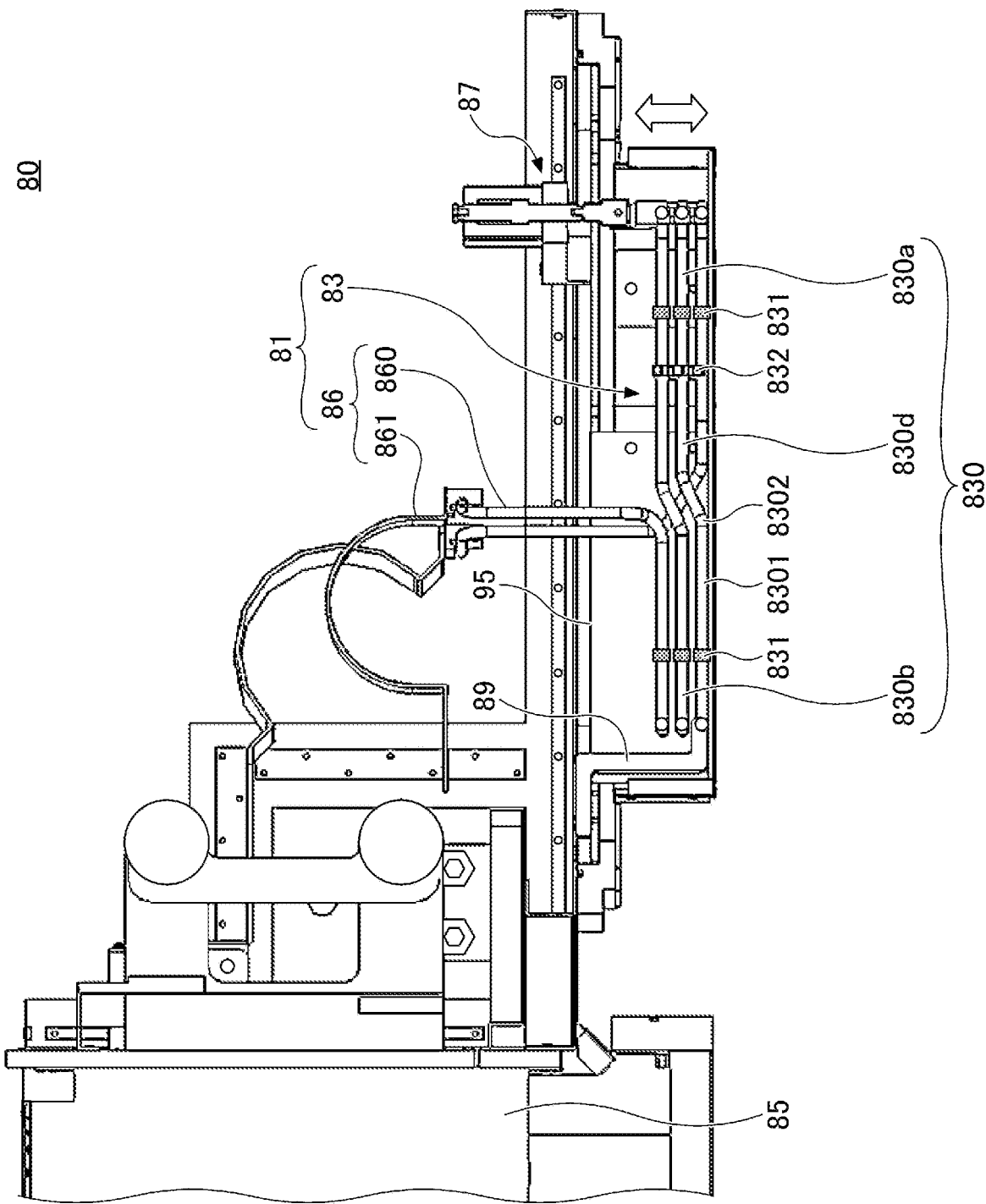
FIG. 12 is a side view of a plasma processing apparatus according to an embodiment of the present disclosure.

FIG. 11 is a perspective view of an antenna device 81 and a plasma generating device 80. FIG. 12 is a side view of an antenna device 81 and a plasma generating device 80.

The antenna device 81 includes an antenna 83, a connection electrode 86, a lifting mechanism 87, a linear encoder 88, and a fulcrum jig 89.

Also, the plasma generating device 80 further includes the antenna device 81, a matching box 84, and a radio frequency power source 85.

The antenna 83 includes an antenna member 830, a coupling member 831 and a spacer 832. The antenna 83 is generally configured in a coil shape, or a track-like shape, and is planar in an elongate annular shape having a longitudinal direction and a shorter direction (or a width direction). The planar shape may be an ellipse having an angle or a shape close to a rectangular frame having an angle. Such a track-like shape of antenna 83 is formed by coupling the antenna members 830. The antenna member 830 is part of the antenna 83 and is formed by connecting ends of a plurality of small antenna members 830 extending along the track-like shape. The antenna member 830 includes a straight portion 8301 having a straight shape and curved portion 8302 having a curved shape for bending and connecting the straight portions 8301.

Then, by combining and connecting the straight portions 8301 and the curved portions 8302, the antenna members 830 are connected to antenna members 830a and 830b at both ends and the antenna members 830c and 830d at central portions to form a track-like shape as a whole. In FIG. 11, the antenna 83 has, as an overall shape, the antenna members 830a and 830b at both ends having a shape close to an arc, and the antenna members 830c and 830d at the central portions having a linear shape. The antenna members 830a and 830b at the ends of the antenna members 830c and 830d in the shape close to the arc are connected to each other with the antenna members 830c and 830d in the central linear shape, and the central antenna members 830c and 830d are substantially parallel to each other. The antenna 83 is generally shaped such that the antenna members 830c and 830d have a long side and the antenna members 830a and 830b have a short side.

As illustrated in FIG. 11, the antenna members 830a and 830b are formed in a shape that approximates an arc shape where three straight portions 8301 are connected via two curved portions 8302. The antenna member 830c is composed of one long straight portion 8301. As illustrated in FIGS. 11 and 12, the antenna member 830d is formed by forming two long straight portions 8301 and one short straight portion between them with steps at the top and the bottom, so that two small curved portions 8302 are formed by being coupled to each other.

The antenna member 830 forms a multi-stage track-like shape as a whole, and in FIGS. 11 and 12, an antenna member 830 is illustrated forming a three-stage track-like shape.

The coupling member 831 is a member for connecting adjacent antenna members 830 to each other and is made with a material that is conductive and can be deformed. The coupling member 831 may be made with, for example, a flexible substrate or the like, and may be made with a copper material. The copper material is a highly conductive and a soft material, and is suitable for coupling the antenna members 830 to each other.

Because the coupling members 831 are made with a flexible material, it is possible to bend the antenna members 830 with the coupling members 831 as a fulcrum. This allows the antenna members 830 to be maintained in a bent state at the point of the coupling members 831, while allowing the configuration of the antenna 83 to be varied. The distance between the antenna 83 and the wafer W is likely to affect the intensity of the plasma process. When the antenna 83 is brought close to the wafer W, the intensity of the plasma process is likely to increase, and when the antenna 83 is removed from the wafer W, the intensity of the plasma process is likely to decrease.

Further, the method of determining the shape of the antenna 83 and the details of the shape will be described below.

When the wafer W is loaded on the recess 24 of the susceptor 2 and the susceptor 2 is rotated to perform the plasma process, the wafer W is positioned along the circumferential direction of the susceptor 2, and the moving speed of the center side of the susceptor 2 is low and the moving speed of the outer side is high. Thus, the intensity (or processing amount) of the plasma process at the center of the wafer W, which is irradiated with plasma for a long time, is likely to be higher than the intensity of the plasma process at the outer periphery. To correct this, for example, if the antenna member 830a disposed on the central side is folded upwardly and the antenna member 830b disposed on the peripheral side is folded downwardly, the central plasma processing intensity is reduced; the peripheral plasma processing intensity is increased, and the overall plasma processing amount is uniform in the radial direction of the susceptor 2.

In FIG. 11, four coupling members 831 are provided for connecting four antenna members 830a to 830d to each other. However, the number of antenna members 830 and connecting members 831 may be increased or decreased depending on the application. At a minimum, the antenna members 830a and 830b at both ends may be present, which may be configured in a long U-shaped shape extending not only at both ends but also to the central portion, and the two antenna members 830a and the antenna members 830b are connected by the two coupling members 831. Further, if the shape of the antenna 83 is desired to be varied more widely, four antenna members 830 may be disposed at the center to increase the bendable portion.

In any case, facing coupling members 831 are preferably disposed at the same position in the longitudinal direction, that is, equal in length in the longitudinal direction of the facing antenna members 830. As noted above, the antenna 83 is preferably configured to change its height in the longitudinal direction, while using the bending points facing each other in the shorter direction and coinciding with each other in the longitudinal direction. In this embodiment, the coupling members 831 coupling the antenna member 830a to the antenna member 830c and the coupling members 831 coupling the antenna member 830a to the antenna member 830d are configured to face each other in the shorter direction and be in the same position in the longitudinal direction. Similarly, the coupling member 831, which couples the antenna member 830b to the antenna member 830c, and the coupling member 831, which couples the antenna member 830b to the antenna member 830d, are also configured to face each other in the shorter direction and be in the same position in the longitudinal direction. Such an arrangement allows the shape of the antenna 83 to be varied to adjust the intensity of the plasma process in the longitudinal direction.

However, when the bending portion is shifted in an oblique direction and a deformation such as a parallel quadrant is desired, it is possible to set the longitudinal positions of the coupling member 831 to different positions on the 830*c* side and the 830*d* side in the oblique direction instead of facing each other in the shorter direction.

A spacer 832 is a member for separating multi-stage antenna members 830 disposed at an upper stage and a lower stage from each other so that even if antenna 83 is deformed, the antenna members 830 do not contact the upper and lower stages and do not cause a short circuit.

The lifting mechanism 87 is a vertical motion mechanism for moving the antenna member 830 up and down. The lifting mechanism 87 includes an antenna retainer 870, a drive unit 871, and a frame 872. The antenna retainer 870 is the retaining portion of the antenna 83 and the drive unit 871 is a driving part for moving the antenna 83 up and down through the antenna retainer 870. The antenna retainer 870 may have various configurations if it can hold the antenna member 830 of the antenna 83, but may be constructed to hold the antenna member 830 around the perimeter of the antenna member 830, for example, as illustrated in FIG. 12.

The drive unit 871 may also use various drivers if the antenna members 830 can be moved up and down, for example, an air cylinder for air drive may be used. In FIG. 12, an example is illustrated in which an air cylinder is applied to the drive unit 871 of the lifting mechanism 87. In addition, a motor or the like may be used for the lofting mechanism 87.

A frame 872 is a support for holding the drive unit 871, and holds the drive unit 871 at an appropriate position. The antenna retainer 870 is retained by the drive unit 871.

The lifting mechanism 87 is disposed for at least two or more of the antenna members 830*a* to 830*d* individually. In this embodiment, deformation of the antenna 83 is performed automatically using the lifting mechanism 87, rather than being adjusted by the operator. Thus, to deform the antenna 83 into various shapes, preferably, each of the antenna members 830*a* to 830*d* individually includes the lifting mechanism 87, each of which operates independently. Thus, the lifting mechanism 87 is preferably disposed for each of the antenna members 830*a* to 830*d*, and the lifting mechanism 87 is disposed for at least two of the antenna members 830*a* to 830*d* even when the lifting mechanism 87 is not disposed for each of the antenna members 830*a* to 830*d*.

In FIGS. 11 and 12, only a single lifting mechanism 87 is shown, but actually, the lifting mechanism 87 is disposed for each of the antenna members 830*a* to 830*d* to be bent. For example, if a lifting mechanism 87 for moving the antenna member 830*a* up and down is disposed at the center of the rotational direction of the susceptor 2 and a lifting mechanism 87 for moving the antenna members 830*c* and 830*d* up and down is further disposed, the antenna members 830*a*, 830*c* and 830*d* can be deformed in any shape. In this case, for example, when it is desired to bend the antenna member 830*a* upwardly at the central end, the lifting mechanism 87 corresponding to the antenna member 830*a* may be pulled up, and the lifting mechanisms 87 corresponding to the antenna members 830*c* and 830*d* may be fixed or lowered, and the antenna members 83 may be deformed by cooperating with a plurality of lifting mechanisms 87. While it is not necessary to do so when the coupling member 831 is sufficiently soft to allow the antenna 83 to bend only by the corresponding lifting mechanism 87. However, while the coupling member 831 may be deformable, when it is necessary to apply some force to the deformation, the plurality of lifting mechanism 87 may cooperate to perform the bending action of the antenna 83.

The bending of the antenna 83 is performed by changing the angle formed between the antenna members 830*a* to 830*d* on both sides of the coupling member 831, while serving the coupling member 831 as the fulcrum.

A linear encoder 88 is a device that detects the position of the linear axis and outputs position information. This allows accurate measurement of the distance of the antenna member 830*a* from the top face of the Faraday shield 95. The linear encoder 88 may be disposed at any position where precise position information is desired, and a plurality of the linear encoders may be disposed. The linear encoder 88 may be any type including an optical, a magnetic, or an electromagnetic inductive type, as long as the position and height of the antenna 83 can be measured. Additionally, as long as the position and height of the antenna 83 can be measured, a height measuring unit other than the linear encoder 88 may be used.

The fulcrum jig 89 is a member for pivotally securing the lowermost antenna member 830. This facilitates tilting the antenna 83. Generally, the fulcrum jig 89 is provided to support the antenna member 830*b* of the lowermost stage at the end of the outer peripheral side. This is because, as noted above, the antenna 83 is often deformed to increase the center side. However, it is not mandatory to provide the fulcrum jig 89, but rather it is preferable to provide the lifting mechanism 87 that moves the antenna member 830*b* up and down.

The connection electrode 86 includes an antenna connecting part 860 and an adjustment busbar 861. The connection electrode 86 is a connection wire that serves as a framing to supply the antenna 83 with high frequency power output from the radio frequency power source 85. The antenna connecting part 860 is an interconnection directly connected to the antenna 83, and the adjustment busbar 861 is a part of the antenna connecting part 860 having a resilient structure to absorb the deformation when the antenna connecting part 860 is moved up and down by the vertical movement of the antenna 83. Because the antenna connecting part 860 is an electrode, the antenna connecting part 860 is made with an electrically conductive material such as metal.

Thus, antenna device 81 and plasma generation apparatus 80 may be used that can automatically transform the shape of the antenna 83 into any shape.

Figure 13:
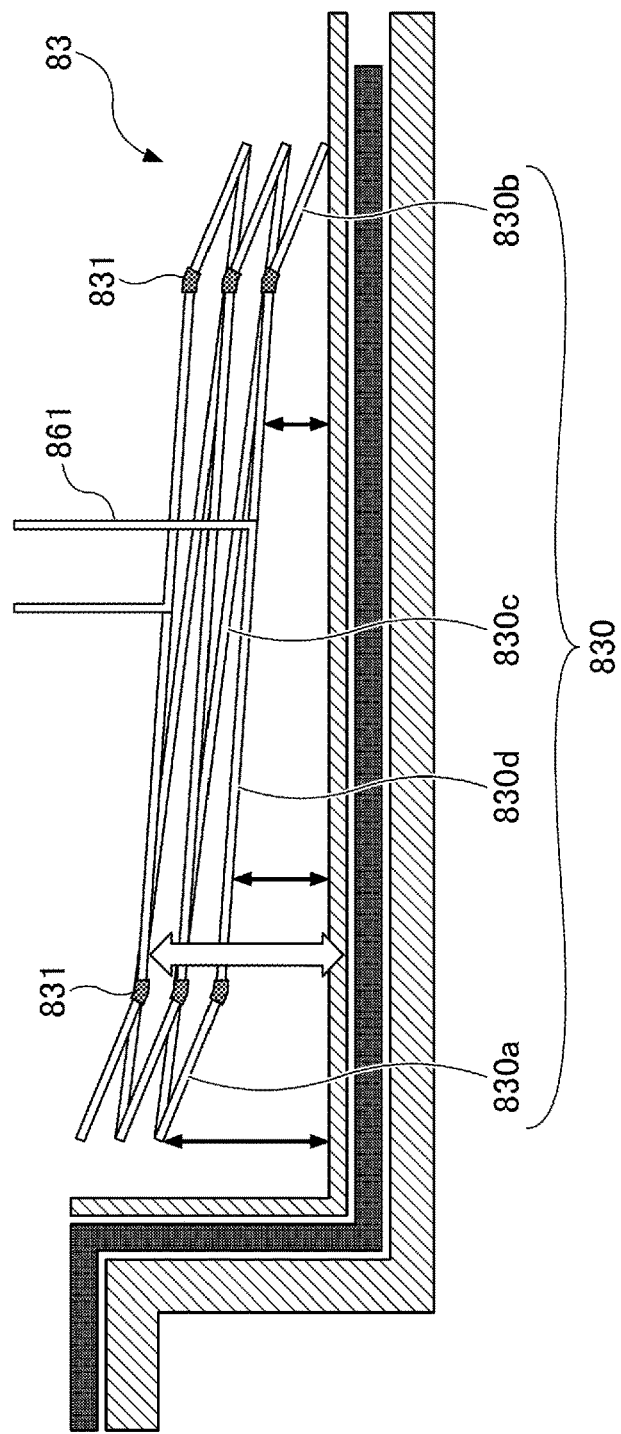
FIG. 13 is a side view of an antenna of a plasma processing apparatus according to an embodiment of the present disclosure.

FIG. 13 is a side view of an antenna 83 according to an embodiment of the present disclosure. As illustrated in FIG. 13, the bending angle of the antenna member 830 may be varied with the coupling member 831 as well as the height of the antenna member 830 depending on the location.

However, if the height of the antenna member 830*a* is too high, the distance between the bottom surface of the housing 90 and the antenna member 830*a* is increased, and the plasma power is unlikely to reach the vacuum chamber 1. As a result, a phenomenon occurs where plasma is unlikely to ignite and unlikely to activate. Specifically, for example, if the height of the antenna member 830*a* is 20 mm or higher, such a phenomenon is likely to occur.

Thus, it is necessary to make the plasma intensity uniform between the central axis side and the outer peripheral side of the susceptor 2 without significantly increasing the distance between the antenna member 830*a* and the bottom surface of the housing 90.

From this viewpoint, the height of the antenna member 830*a* is lowered as low as possible, and an ion trap plate 140 is provided in the vacuum chamber 1 to compensate for the lack of adjustment amount (see FIG. 4).

[Ion Trap Plate]

Figure 14:
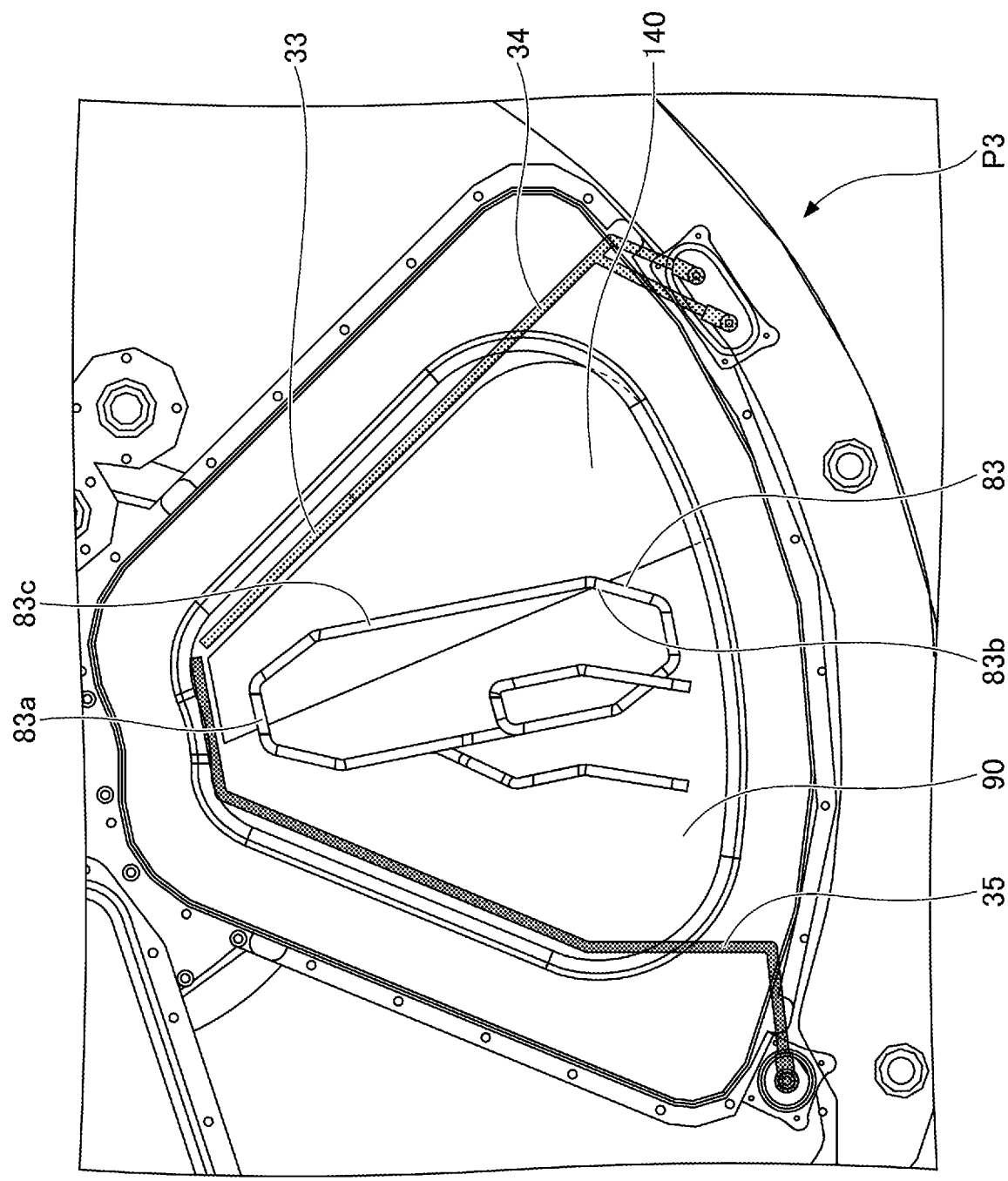
FIG. 14 is a diagram illustrating an example of a plasma processing apparatus including an ion trap plate according to an embodiment of the present disclosure.

FIG. 14 is a diagram illustrating an example of a plasma processing apparatus including an ion trap plate according to an embodiment. FIG. 14 illustrates an enlarged plasma processing area P3. FIG. 14 shows a plasma processing area P3 transparently, but because the housing 90 is actually transparent, it is equivalent to a top view. As illustrated in FIG. 4, a plasma trap plate 140 is disposed in the vacuum chamber 1.

As illustrated in FIG. 14, for example, the ion trap plate 140 is configured to overlap a portion of the outer edge of the bottom surface of the housing 90. In FIG. 14, a portion of a covering area 83c between a point 83a and a point 83b of the antenna 83 is covered with the ion trap plate 140.

The covering area 83c includes a broad area at the center of the susceptor 2 of the antenna 83, but does not include the most outer area. That is, much of the central area of the antenna 83 is covered with the ion trap plate 140, but the peripheral area of the antenna 83 is covered less or not at all.

Thus, by disposing an ion trap plate 140 in an area overlapping the antenna 83, the ions generated by the plasma can be blocked and the oxidizing power of the plasma can be decreased. Thus, the ion trap plate 140 may be referred to as an ion block plate or an ion shield plate. Therefore, even if the set height of the antenna 83 (the antenna member 830a) is lowered, the oxidizing power of the central axis side region of the susceptor 2 is reduced, and the plasma oxidizing power in the radial direction can be made uniform.

The ion trap plate 140 may not necessarily trap ions, but may block ions, and it may be possible to partially restrict the supply of oxidizing gas ions to the wafer W in an area on the central axis side of the antenna 83.

For example, it is possible to set the height of the antenna member 830a to 15 mm, 10 mm, 0 mm, and 15 mm or less and to prevent the plasma from being extinguished and from failing to ignite.

The shape of the ion trap plate 140 and the area overlapping the antenna 83 can be set in various ways depending on the use application. In FIG. 14, the planar shape of the ion trap plate 140 is configured to diagonally traverse the antenna 83, but various modifications are possible depending on the use application.

Figure 15:
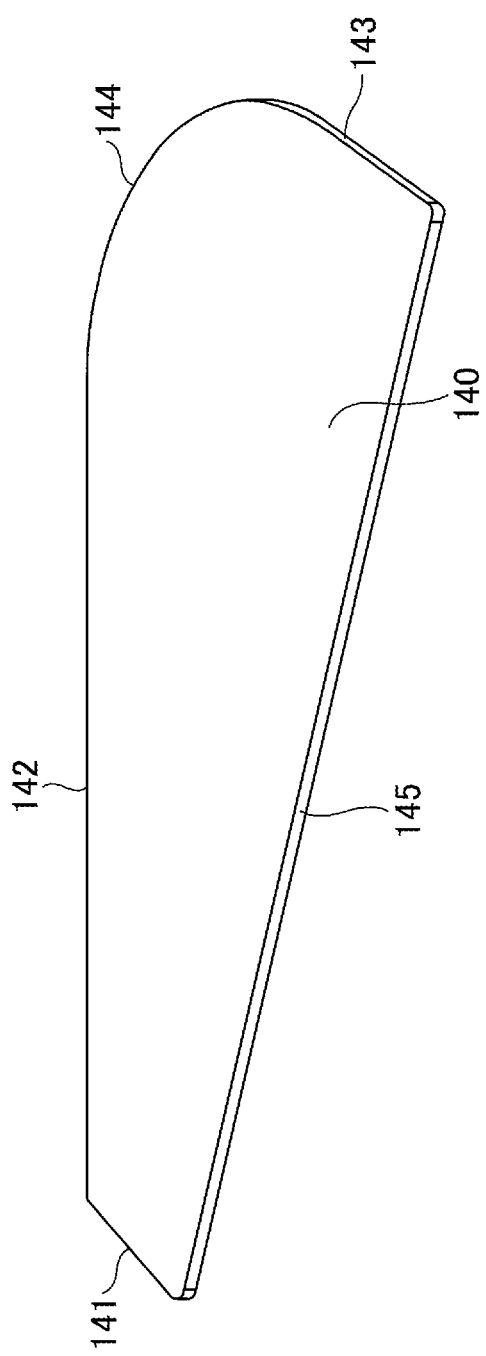
FIG. 15 is a diagram illustrating an example of an ion trap plate.

FIG. 15 is a diagram illustrating an example of an ion trap plate 140. The ion trap plate 140 has a circumferentially extending side 141 on the central axis side of the susceptor 2 and a radially extending side 145. The ion trap plate 140, in order to connect the end of the central axis side 141 to the outer peripheral end of radially extending side 145, also has a radially obliquely extending side 142, a circumferentially extending side 143, and a curve 144 formed by rounding the sides 142 and 143 and curvaceously connecting the side 142 to the side 143 so as to form a curved angle.

Preferably, the ion trap plate 140 is literally formed as a plate. This is because the space in the vacuum chamber 1 is limited and because the thin plate shape is sufficient to perform a function of blocking or trapping ions.

A material for the ion trap plate 140 suitable to the application may be used as long as the ion trap plate can block or trap ions, and quartz may be used, for example. Quartz can be suitably utilized because the housing 90 is also quartz, and quartz can withstand high temperatures, and is unlikely to cause contamination.

Figure 16:
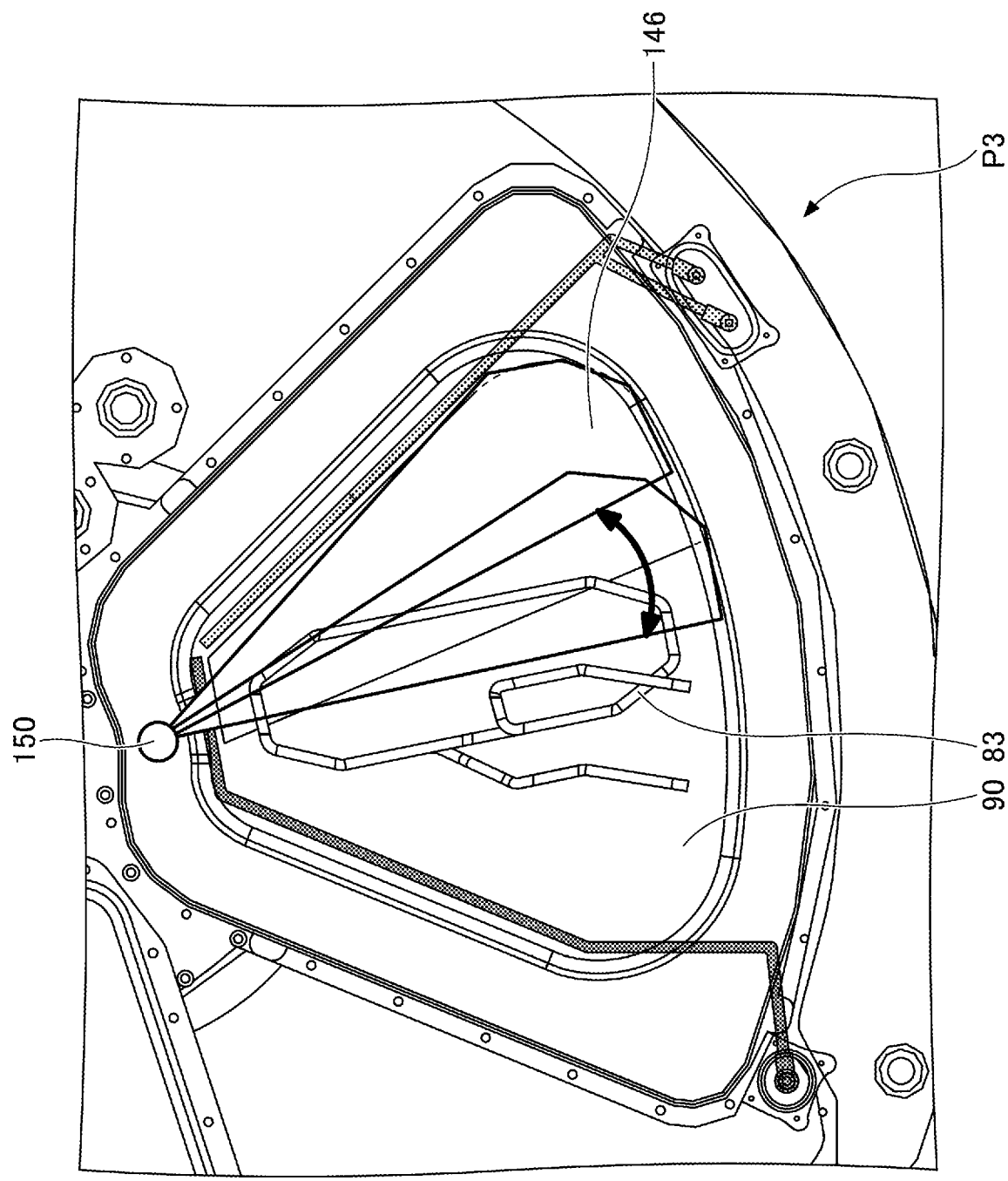
FIG. 16 is a diagram illustrating an example of a movable ion trap plate.

FIG. 16 illustrates an example of a movable ion trap plate 146. As illustrated in FIG. 16, a pivot shaft 150 may be disposed, and an area covering the antenna 83 may be changed by rotating the movable ion trap plate 146 about the pivot shaft 150.

Preferably, when an ion trap plate is formed as the mobile ion trap plate 146, the entire configuration is formed small and formed into a movable shape within the plasma processing area P3. In FIG. 16, the tip is narrowed and the overall width is smaller than the ion trap plate 140.

The movable configuration allows adjustment of the amounts of trapped ions and blocked ions depending on the process, and fine adjustment of the oxidizing power. Thus, depending on the use application, such a mobile ion trap plate 146 may be adopted.

Figure 17A:
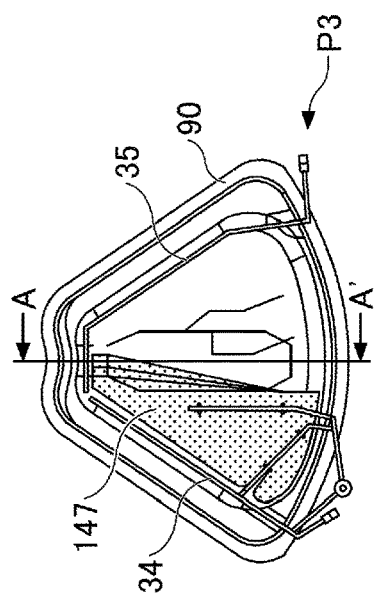
FIGS. 17A and 17B are diagrams illustrating an arrangement example of an ion trap plate in a vacuum chamber.
Figure 17B:
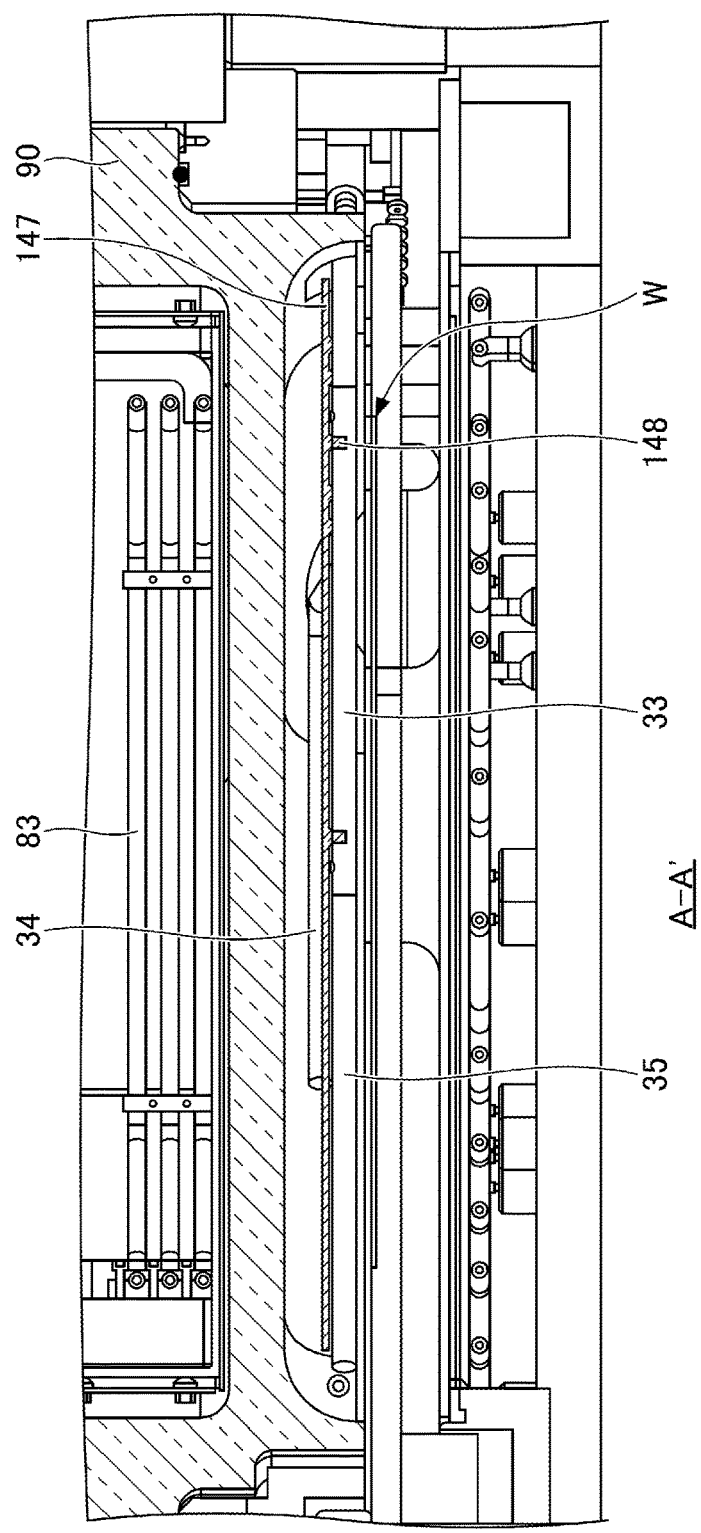

FIGS. 17A and 17B are diagrams illustrating an example of an arrangement of an ion trap plate in a vacuum chamber 1. FIG. 17A illustrates an example of an ion trap plate 147 disposed in a left area of the housing 90. In this manner, the ion trap plate 147 can be positioned both on the right side and the left side as long as the ion trap plate 47 efficiently covers the area on the central axis side of the antenna 83.

FIG. 17B is a partial cross-sectional view illustrating an example of a vertical structure of a plasma processing apparatus including an ion trap plate 147. As illustrated in FIG. 17B, the ion trap plate 147 is disposed on the plasma processing gas nozzles 33 to 35. The ion trap plate 147 may have a plurality of stops 148 and be fixed to the plasma processing gas nozzles 33 to 35. FIG. 17B illustrates an example of the ion trap plate 147 being disposed on the plasma processing gas nozzles 33 to 35, but the ion trap plate 147 may be supported by a separate support and disposed above the plasma processing gas nozzles 33 to 35.

The ion trap plates 140 and 146 may be disposed in the vacuum chamber 1 in the same manner as the ion trap plate 147.

By disposing ion trap plates 140, 146, and 147 on or above the plasma processing gas nozzles 33 to 35, ions can be trapped and the oxidizing power can be adjusted without hindering the flow of the plasma processing gas.

This reduces the tilt of the antenna 83 and maintains the plasma in a stable condition.

According to the embodiments of the present disclosure, the supply of ions generated by a plasma antenna can be adjusted.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:
1. A plasma processing apparatus, comprising:
a process chamber;
a turntable disposed in the process chamber and configured to receive a substrate along a circumferential direction thereof;
a process gas supply nozzle configured to supply a process gas to the turntable;
a plasma antenna disposed on the process chamber at a position covering at least a part of the process gas supply nozzle; and
an ion trap plate disposed over the process gas supply nozzle at a position overlapping at least a part of the plasma antenna in the process chamber.
2. The plasma processing apparatus as claimed in claim 1, wherein the plasma antenna is disposed to cover the turntable in a radial direction of the turntable, and wherein the ion trap plate has a planar shape extending in the radial direction of the turntable.

3. The plasma processing apparatus as claimed in claim 2, wherein the ion trap plate is disposed such that an area of the ion trap plate overlapping the plasma antenna is larger at a central side than at a peripheral side of the turntable.

4. The plasma processing apparatus as claimed in claim 3, wherein the plasma antenna has a coil shape extending along the turntable in the radial direction thereof, and
wherein the ion trap plate is disposed so as to obliquely cover the part of the plasma antenna.

5. The plasma processing apparatus as claimed in claim 3, wherein the plasma antenna is tilted so as to be higher at the central side than at the peripheral side.

6. The plasma processing apparatus as claimed in claim 3, wherein the ion trap plate is disposed on the process gas supply nozzle.

7. The plasma processing apparatus as claimed in claim 3, wherein the ion trap plate made with a material that blocks ions.

8. The plasma processing apparatus as claimed in claim 7, wherein the ion trap plate is made with quartz.

9. The plasma processing apparatus as claimed in claim 3, wherein the ion trap plate is movable.

10. The plasma processing apparatus as claimed in claim 9, wherein the ion trap plate is pivotally fixed to the central side and an angle of the ion trap plate is adjustable.

* * * * *